US006452248B1

United States Patent
Le

(10) Patent No.: US 6,452,248 B1
(45) Date of Patent: Sep. 17, 2002

(54) LOW-POWERED, SELF-TIMED, ONE-TIME IN-CIRCUIT PROGRAMMABLE MOS FUSE ELEMENT AND CIRCUIT

(75) Inventor: Hung Pham Le, San Jose, CA (US)

(73) Assignee: Exar Corporation, Fremont, CA (US)

( * ) Notice: Subject to any disclaimer, the term of this patent is extended or adjusted under 35 U.S.C. 154(b) by 41 days.

(21) Appl. No.: 09/639,707

(22) Filed: Aug. 14, 2000

(51) Int. Cl.⁷ .......................... H01L 29/00; H01L 21/82
(52) U.S. Cl. ...................................... 257/530; 438/131
(58) Field of Search ................................ 438/131, 132; 257/529, 530

(56) References Cited

U.S. PATENT DOCUMENTS

| 4,651,409 A | | 3/1987 | Ellsworth et al. ......... 29/576 B |
| 4,757,359 A | * | 7/1988 | Chiao et al. .............. 357/23.5 |
| 5,212,102 A | | 5/1993 | Iranmanesh et al. ........ 437/31 |
| 5,291,434 A | * | 3/1994 | Kowalski .................... 365/96 |
| 5,311,039 A | | 5/1994 | Kimura et al. ............... 257/50 |
| 5,888,873 A | * | 3/1999 | Krivokapic ................ 438/289 |

OTHER PUBLICATIONS

"*memory design handbook*", Intel Corporation 1977.

\* cited by examiner

*Primary Examiner*—Olik Chaudhuri
*Assistant Examiner*—William Vesperman
(74) *Attorney, Agent, or Firm*—Townsend and Townsend and Crew LLP

(57) ABSTRACT

A programmable fuse structure using an MOS transistor. A voltage potential is switched across the gate of the MOS transistor, with the gate resistance causing it to heat the MOS structure. This causes a short at one or more of a number of locations in the MOS structure, thereby programming the MOS transistor. A programming circuit with the MOS transistor in a feedback path is provided. This feedback provides a self-timing feature, such that immediately after the fuse is programmed, its programming operation ceases.

6 Claims, 3 Drawing Sheets

| BIT (t=0) | PE | Select | BIT (t=t) | PG | Commands |
|---|---|---|---|---|---|
| 1 | 0 | 0 | 1 | 0 | Not yet programmed. |
| 1 | 0 | 1 | 1 | 0 | Logical 1, Normal Operation |
| 1 | 1 | 0 | 0 | 0 | |
| 1 | 1 | 1 | 1→0 | 1→0 | Programming enabled, bit selected |
| 0 | 0 | 0 | 0 | 0 | |
| 0 | 0 | 1 | 0 | 0 | Bit is already programmed, always 0. |
| 0 | 1 | 0 | 0 | 0 | No further programming is possible |
| 0 | 1 | 1 | 0 | 0 | |

| BIT (t=0) | PE | Select | BIT (t=τ) | PG | Commands |
|---|---|---|---|---|---|
| 1 | 0 | 0 | 1 | 0 | Not yet programmed. |
| 1 | 0 | 1 | 1 | 0 | Logical 1, Normal Operation |
| 1 | 1 | 0 | 0 | 0 | |
| 1 | 1 | 1 | 1→0 | 1→0 | Programming enabled, bit selected |
| 0 | 0 | 0 | 0 | 0 | |
| 0 | 0 | 1 | 0 | 0 | Bit is already programmed, always 0. |
| 0 | 1 | 0 | 0 | 0 | No further programming is possible |
| 0 | 1 | 1 | 0 | 0 | |

*FIG. 4.*

LOW-POWERED, SELF-TIMED, ONE-TIME IN-CIRCUIT PROGRAMMABLE MOS FUSE ELEMENT AND CIRCUIT

BACKGROUND OF THE INVENTION

The present invention relates to one-time programmable elements in an integrated circuit.

Fuses are frequently used in IC designs for a low-density, non-volatile circuit configuration. A fuse is typically made of a narrow line of metal or poly layer or of a conductive layer material available in an IC process, which can be melted when sufficient Joules heating occurs with sufficient current passing through the fuse. Power dissipated as heat is proportional to the fuse resistance and the square of the current, $P=R*I*I$.

Typical requirements and constraints of design and programming of fuses are:

High current (0.3 amps and higher) is needed to raise enough temperature to melt fuses.

If the parasitic path resistance is high, a power source capable of outputting a high voltage at high current is needed.

Two probe pads or pins physically near each other are needed to minimize parasitic internal resistance and to allow passing high current. A common pad or pin can be shared, but at least one probe pad or pin per fuse is required.

Melted metal or poly has to be physically displaced, requiring exposure to empty space (air) typically realizable with a passivation opening. Exposed fuses can be subject to contamination, corrosion, and material regrowth.

The advantage of conventional fuse use is that it is a simple, inexpensive, brute-force way to realize a one-time programmable element. The disadvantages of conventional fuse and its use are many, and among them are:

High current programming requiring elaborate optimized timing and circuitry.

IC chip is subject to transients and spikes with high-current steering.

Probe pads or pins wasting valuable silicon space especially for pad-limited designs.

High-temp (>450C) stressful event; material is melted and spread.

Questionable reliability of blown and unblown fuses.

Programming must be done before final packaging, therefore doubling the test costs.

Fuse trimming not done on final performances of final parts→potential yield fallout.

Fuses cannot be selected with internal logic. Their programming is determined by which probe pads or pins current are applied.

In addition to fuses, semiconductor ROMs and PROMs provide one-time programmable memories. A ROM is typically made at the time the wafer is made, with the programming being done with the interconnect layer of aluminum. PROMs are electrically programmable after final packaging. Early PROMs used a nichrome fuse. Nichrome, an alloy of nickel and chrome, was deposited as a very thin film link to column lines of the PROM. Heavy currents caused this film to blow, opening up the connection between the PROM column lines.

A later type of PROM uses a polycrystalline silicon as a fuse. The fuse is blown with a pulse train of increasingly wider pulses with a current of 20–30 mA typically needed to blow the fuse. During this operation, temperatures estimated at 1400° C. are reached in the notch of the polysilicon fuse. At these temperatures, the silicon oxidizes and forms an insulating material.

Yet another type of PROM uses a bipolar junction. A diode is reverse-biased, and the heavy flow of electrons in a reverse direction causes aluminum atoms from the emitter contact to migrate through the emitter to the base, causing an emitter-to-base short.

In MOS technology, erasable PROMs are formed using a floating gate which can have charge placed on it and then removed either with ultraviolet light or electrically.

SUMMARY OF THE INVENTION

The present invention provides a programmable fuse structure using an MOS transistor. A voltage potential is switched across the gate of the MOS transistor, with the gate resistance causing it to heat the MOS structure. This causes a short at one or more of a number of locations in the MOS structure, thereby programming the MOS transistor.

In one embodiment, one side of the gate is connected to ground, and the ate is actually a number of gates connected in parallel to provide increased heating. The ate is made of polysilicon which is a more efficient heating structure than metal used in metal fuse. The gate has a thickness of less than 0.5 microns.

A programming circuit with the MOS transistor in a feedback path is provided. This feedback provides a self-timing feature, such that immediately after the fuse is programmed, its programming operation ceases. This prevents unnecessary heating and wasting of power. An additional function of the programming circuit is to ensure that the fuse is not accidentally or unintentionally programmed.

In order to improve the efficiency of programming, the switching device is impedance matched with polysilicon fuse gate of the MOS structure. In addition, the MOS layout is optimized for MOS thermal-related failures.

The purpose of this invention is to create a reliable, low-current, low-temperature, low-powered, pad-less, completely passivated, high-density, logic-selectable, one-time programmable element and its support circuitry. The device can be selected and programmed at final test using logic, and uses the internal chip power supply. It can also be one-time programmed during normal operation at any time to a recalibrate performances or adjust chip parameters. It does not need to be exposed and probe pads or pins are not required, hence it can be placed anywhere in a chip as many times as it is needed.

For a further understanding of the nature and advantages of the invention, reference should be made to the following description taken in conjunction with the accompanying drawings.

BRIEF DESCRIPTION OF THE DRAWINGS

FIG. 4 is a table illustrating the bit levels before and after programming using the circuit of FIG. 3.

DESCRIPTION OF THE SPECIFIC EMBODIMENTS

The present invention uses the polysilicon gate of a MOS structure to be a heating element to destroy its MOS junction (shorting it to substrate) with localized heat damage. A MOS structure with submicron geometries (gate oxide dielectrics, junction thickness) can be damaged at a lower temperature and more easily than what it takes to melt polysilicon (1400C) or metal (450C). The junction when not programmed is isolated from ground and its potential can be pulled up and sensed as logical 1. Once is it a programmed, it is shorted to ground with a low impedance and can be sensed as a logical 0.

Figure 1:
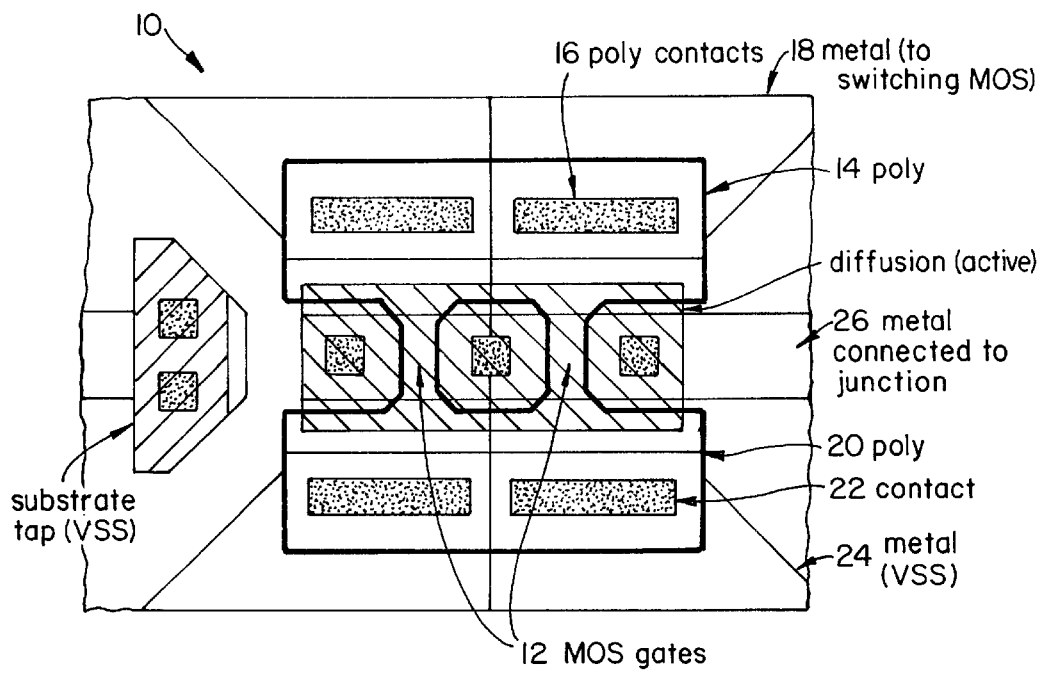
FIG. 1 is a top view of an MOS transistor configured as a fuse according to an embodiment of the present invention.

FIG. 1 illustrates an MOS device 10 having two parallel polysilicon gates 12. The top portion of these gates form a polysilicon area 14 connected by polysilicon contacts 16 to a metal connection 18 which connects to a switching MOS transistor. The bottom portion of gates 12 is a polysilicon area 20 which is connected by polysilicon contacts 22 to another metal trace 24 which is connected to Vss (ground).

Thus, when a voltage is switched onto metal line 18, a voltage potential is developed across the narrow, somewhat resistive polysilicon gates, causing localized heating to damage the junctions and cause shorting.

Figure 2:
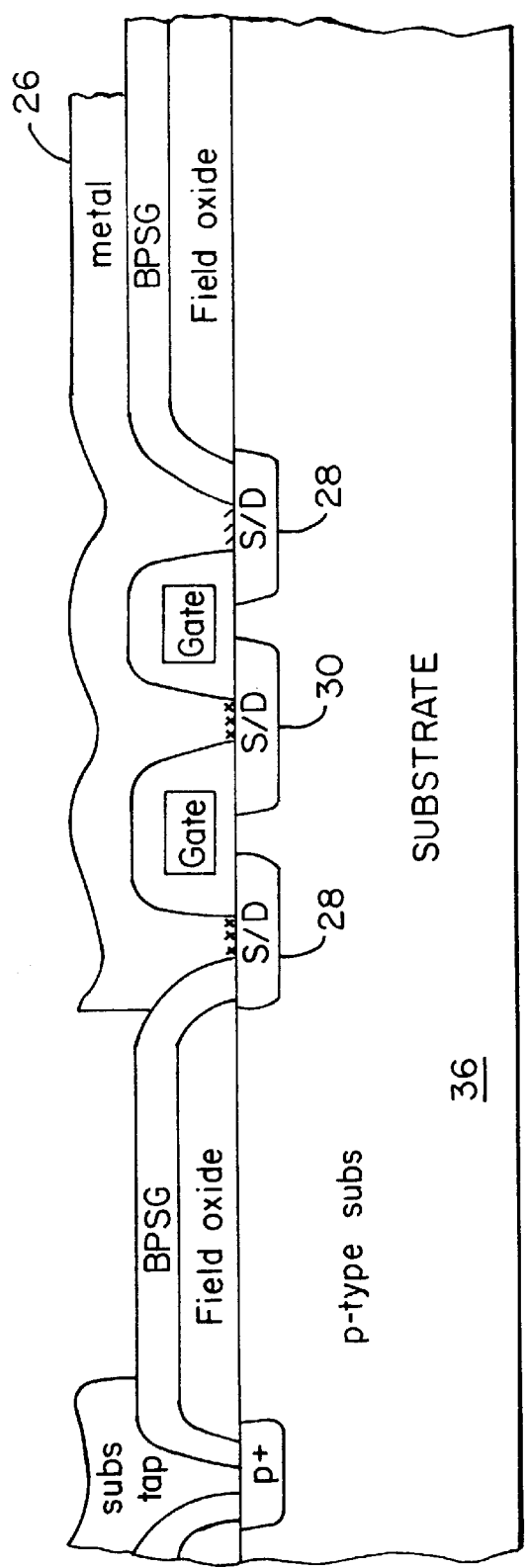
FIG. 2 is a side, cut-away view of a structure as in FIG. 1.

The side view of FIG. 2 helps illustrate the other elements of the structure of FIG. 1. A metal layer 26 connects to a drain 28 and a source 30, coupling them together. This metal is not connected to anything, leaving the drain and source floating. A metal layer 34 is connected to Vss (ground) and connects to the substrate 36.

The heating of the MOS structure provides several failure modes, one or more of which is sufficient to provide the programming by connecting the MOS source/drain to ground. For example, the grounded portion of the gate can be shorted to the drain and source, or a short through the gate oxide connects the gate to the junction, connected to the grounded substrate.

Failures happen where:
junction is shorted to substrate ground at poly gate edge;
junction is shorted to substrate ground at LOCOS edges;
bottom junction is shorted to substrate ground;
junction is shorted to substrate ground when metal at contact area is melted and reaches through substrate;
gate oxide is ruptured, shorting poly gate to junction at gate edge;
metal connected to junctions is melted on top of poly gate and spikes through dielectrics separating metals and poly gate.

As can be seen, either a short to the gate ground at the bottom of FIG. 1, or a short to the grounded substrate is sufficient to program the MOS structure.

Figure 3:
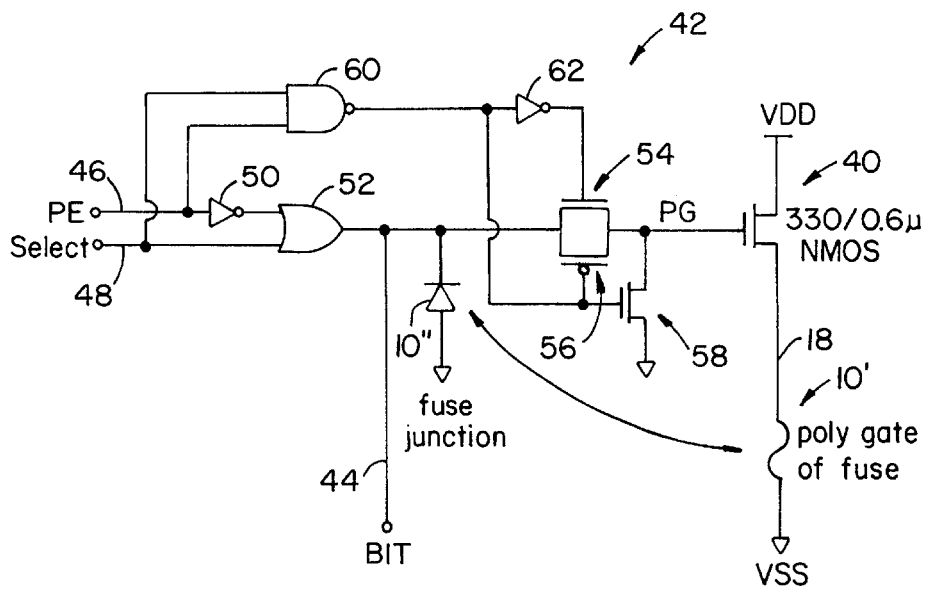
FIG. 3 is circuit diagram of the fuse of FIG. 1 with an associated switching and programming circuit.

FIG. 3 illustrates a programming and switching circuit. The MOS structure of FIG. 1 is actually shown in two places, as the poly gate of the fuse 10' and a diode for the fuse junction, 10". A switching transistor 40 connects the metal line 18 of FIG. 1 to $V_{DD}$. A programming circuit 42 turns on and off the gate of transistor 40 when programming is desired. Diode 10" provides feedback to shut off the programming circuit when programming is completed, providing a self-timed feature. The output of the programmed element is provided on a bit line 44.

As can be seen, the programming has a programming enable (PE) input 46 and a select input 48. The programming enable input is provided through an inverter 50 to an OR gate 52 with select line 48. These are connected to the bit output 44, and also to two transistors 54 and 56. The program enable and select inputs are also provided through a NAND gate 60 to the gates of transistors 56 and 58, and through an inverter 62 to the gate of transistor 54.

FIG. 4 is a table illustrating the value of the bit output on line 44 at t=0 and t=a subsequent time for various combinations of the programming enable (PE) and select control signals. Also shown is the value at the programming gate (PG) node at the gate of transistor 40.

Alternate circuits could be provided to program the MOS structure of the present invention. By providing a feedback as in FIG. 3, self-timing programming is provided such that immediately after the fuse is programmed, its programming operation ceases. This prevents unnecessary heating and wasting of power. An additional function of the programming circuit is to ensure that the fuse is not accidentally or unintentionally programmed.

In order to improve the efficiency of programming, the switching device 40 is impedance matched with polysilicon fuse gate 12 of the MOS structure. In addition, the MOS structure layout is optimized for MOS thermal-related failures. In particular, the embodiment of FIG. 1 essentially provides two parallel polysilicon gates, forming three junctions, with the center junction being surrounded by the two gates as evidenced from FIG. 1. By providing each polysilicon gate with a minimum width, the resistance and thus the heating is improved.

In the embodiment of FIGS. 1 and 3, the switching MOS transistor 40 can pass 100–200mA of current from the voltage source (Vdd) to ground through the narrow polysilicon gates. This causes the polysilicon gates to heat up its own junctions, causing hem to be shorted to substrate ground or shorted to the polysilicon ground at various areas. For 150mA of current passing through 10 ohms of the polysilicon gate resistance, the dissipated heating power is 0.225W, which is more than sufficient to damage the MOS structure. For comparison, metal fuses (0.3 ohms) require only 300mA and 0.25W to be melted and blown.

As illustrated in FIG. 3, transistor 40 is a much larger dimensioned transistor than MOS transistor 10. This ensures that the resistive heating is almost entirely through the gate of transistor 10. For example, while the dimensions of transistor 40 are $500\mu^2$, while the dimensions of transistor 10 are $10\mu^2$ in one embodiment.

As will be understood by those of skill in the art, the present invention may be embodied in other specific forms without departing from the essential characteristics thereof. For example, a single gate could be used, or three gates or different shaped gates could be used for the MOS structure. Additionally, instead of an NMOS structure, a PMOS structure could be used. Accordingly, the foregoing description is intended to be illustrative, but not limiting, of the scope of the invention which is set forth in the following claims.

What is claimed is:

1. A programmable fuse structure comprising:
an MOS transistor having a source, a drain and a polysilicon gate;
a first voltage potential coupled to a first end of said gate;
a switching circuit configured to connect a second voltage potential to a second end of said gate;
said gate having a geometry which, upon the application of said second voltage potential to said gate, causes a short in said MOS transistor;
wherein both a gate oxide thickness, and a junction thickness between said source and said drain is submicron;
wherein said source and drain are floating and are tied together; and
wherein said switching circuit and said gate are impedance matched.

2. The structure of claim 1 wherein said gate comprises multiple strips separated by gaps.

3. The structure of claim 1 further comprising a programming circuit coupled to said switching circuit with a feedback path connected to said MOS transistor to switch off said switching circuit when said MOS transistor is programmed.

4. A programmable fuse structure comprising:
 an MOS transistor having a source, a drain and a gate;
 a first voltage potential coupled to a first end of said gate;
 a switching circuit configured to connect a second voltage potential to a second end of said gate; and
 said gate having a geometry which, upon the application of said second voltage potential to said gate, causes a short in said MOS transistor, wherein said source and drain are floating and are tied together.

5. A programmable fuse structure comprising:
 an MOS transistor having a source, a drain and a gate;
 a first voltage potential coupled to a first end of said gate;
 a switching circuit configured to connect a second voltage potential to a second end of said gate; and
 said gate having a geometry which, upon the application of said second voltage potential to said gate, causes a short in said MOS transistor, further comprising a programming circuit coupled to said switching circuit with a feedback path connected to said MOS transistor to switch off said switching circuit when said MOS transistor is programmed.

6. A programmable fuse structure comprising:
 an MOS transistor having a source, a drain and a gate;
 a first voltage potential coupled to a first end of said gate;
 a switching circuit configured to connect a second voltage potential to a second end of said gate; and
 said gate having a geometry which, upon the application of said second voltage potential to said gate, causes a short in said MOS transistor, wherein said gate comprises multiple strips separated by gaps.

* * * * *